(12) United States Patent
Agarwal

(10) Patent No.: US 6,537,912 B1
(45) Date of Patent: Mar. 25, 2003

(54) METHOD OF FORMING AN ENCAPSULATED CONDUCTIVE PILLAR

(75) Inventor: Vishnu Kumar Agarwal, Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/645,776

(22) Filed: Aug. 25, 2000

(51) Int. Cl.⁷ ............................................. H01L 21/44
(52) U.S. Cl. ........................ 438/687; 438/637; 438/626; 438/627; 438/629
(58) Field of Search ........................ 438/254, 253, 438/396, 397, 240, 238, 239; 257/306, 310, 532, 534

(56) References Cited

U.S. PATENT DOCUMENTS

| 4,549,927 | A | 10/1985 | Goth et al. |
| 4,866,008 | A | 9/1989 | Brighton et al. |
| 5,008,730 | A | 4/1991 | Huang et al. |
| 5,470,789 | A | 11/1995 | Misawa |
| 5,581,436 | A | 12/1996 | Summerfelt et al. |
| 6,034,389 | A | 3/2000 | Burns, Jr. et al. |
| 6,046,108 | A | 4/2000 | Liu et al. |
| 6,054,331 | A | 4/2000 | Woo et al. |
| 6,114,238 | A | 9/2000 | Liao |
| 6,114,243 | A | 9/2000 | Gupta et al. |
| 6,130,124 | A | * 10/2000 | Lee ........................... 438/240 |
| 6,168,991 | B1 | * 1/2001 | Choi et al. .................. 438/254 |
| 6,274,499 | B1 | 8/2001 | Gupta et al. |
| 6,291,082 | B1 | 9/2001 | Lopatin |
| 6,320,213 | B1 | 11/2001 | Kirlin et al. |
| 6,342,444 | B1 | 1/2002 | Higashi et al. |

* cited by examiner

Primary Examiner—David Nelms
Assistant Examiner—Dung Anh Le
(74) Attorney, Agent, or Firm—Killworth, Gottman, Hagan & Schaeff LLP

(57) ABSTRACT

The present invention provides an encapsulated 3-D conductive pillar and a method of formation thereof. Significant economic savings are achieved by filling a substantial portion of the volume of the pillar with a lesser expensive conductive material. Additionally, the encapsulated 3-D conductor pillar forms a suitable unreactive, oxygen-stable electrode for use with high-dielectric constant (HDC) materials as the encapsulating barrier layer metal provides a stable conductive interface between the HDC material and the encapsulated conductive material.

57 Claims, 4 Drawing Sheets

METHOD OF FORMING AN ENCAPSULATED CONDUCTIVE PILLAR

The invention generally relates to microelectronic structures, and more particularly, to an encapsulated three dimensional (3-D) conductive pillar suitable for use with high-dielectric constant materials and a method of formation thereof.

BACKGROUND OF THE INVENTION

Recent efforts for increasing capacitor density on an electronic substrate have focused on using high dielectric constant (HDC) materials as the capacitor dielectric. Currently the most promising dielectrics are perovskites, a family of HDC materials recognized for their excellent charge storage properties. However, with some of these HDC materials (e.g. $Ta_2O_5$, $TiO_2$ and $(Ba,Sr)TiO3$ (BST), a good barrier layer with effective diffusion and reaction barrier properties are required since traditional microelectronic electrodes react adversely to such materials, reducing their beneficial properties.

Accordingly, it is recognized in the industry that an oxygen stable electrode is required for use with such HDC materials. Exotic materials such as noble metals (Pt, Rh) have been considered as the non-reactive electrode material. However, extravagant use of such materials as an electrode material is prohibitive due to their cost. Additionally, at least a 1200 angstroms (Å) conductive layer is required in order to form a suitable 3-D conductive pillar of 0.46 microns by 0.23 microns. Specifically for Pt, depositing such a conductive layer takes upwards of 15 minutes per wafer due to its very slow deposition rate using conventional deposition techniques. Such a long processing time per wafer is undesirable due to the increase in production expenses.

Accordingly, there is a need for a 3-D conductive pillar which is both suitable as an oxygen stable electrode for use with a HDC material and economical to produce.

SUMMARY OF THE INVENTION

The present invention provides an encapsulated 3-D conductive pillar and a method of formation thereof. Significant economic savings in material costs and production run times are achieved by filling a substantial portion of the volume of the pillar with a less expensive conductive material which can be deposited at a higher depositing rate. Additionally, the 3-D conductive pillar forms a suitable unreactive, oxygen-stable electrode for use with HDC materials as the encasing barrier layer metal provides a stable conductive interface between the HDC material and the encapsulated conductive material.

In accordance with one aspect of the invention provided in a first embodiment is a microelectronic structure comprising a substrate layer, a thin barrier layer metal on the substrate layer, and a conductive material encapsulated by the thin barrier layer metal. Provided in a second embodiment is a microelectronic capacitor comprising an insulating substrate layer having a conductive plug. The microelectronic capacitor further includes a thin barrier layer metal on the insulating substrate layer over the conductive plug, a conductive material encapsulated by the thin barrier layer metal, a dielectric layer provided over the barrier layer metal, and a top electrode layer provided over the dielectric layer. Provided in a third embodiment is a memory device having a microelectronic structure, the microelectronic structure comprising a substrate layer, a thin barrier layer metal on the substrate layer, and a conductive material encapsulated by the thin barrier layer metal. Provided in a fourth embodiment is a memory device having a capacitor, the capacitor comprising an insulating substrate layer having a conductive plug, a thin barrier layer metal on the insulating substrate layer over the conductive plug, a conductive material encapsulated by the thin barrier layer metal, a dielectric layer provided over the barrier layer metal, and a top electrode layer provided over the dielectric layer. Provided in a fifth embodiment is a computer system, the computer system includes a microelectronic device, the device comprises a substrate layer, a thin barrier layer metal on the substrate layer, and a conductive material encapsulated by the thin barrier layer metal. Provided in a sixth embodiment is a computer system, the computer system includes a microelectronic device, the device comprises an insulating substrate layer having a conductive plug, a thin barrier layer metal on the insulating substrate layer over the conductive plug, a conductive material encapsulated by the thin barrier layer metal, a dielectric layer provided over the barrier layer metal, and a top electrode layer provided over the dielectric layer.

In accordance with a second aspect of the present invention provided is a method of forming an encapsulated microelectronic structure suitable for use with a high-dielectric constant material. The method comprises providing a substrate layer, forming a container having a bottom and sidewalls from the substrate layer, and depositing a thin first layer of a barrier layer metal on the substrate layer covering at least the bottom and sidewall of the container. The method further comprises depositing a conductive material on the barrier layer metal substantially completely filling the container, depositing a thin second layer of the barrier layer metal on the conductive material to encapsulate the conductive material in the container, and planarizing the thin second layer of the barrier layer metal.

In accordance with the second aspect of the present invention provided is another method of forming an encapsulated microelectronic structure suitable for use with a high-dielectric constant material. The method comprises providing a substrate layer having a surface, forming a container having a bottom and sidewall from the substrate layer, and depositing a thin first layer of a barrier layer metal covering the bottom and sidewall of the container and the surface of the substrate. The method further includes depositing a conductive material covering the first layer of a barrier layer metal and completely filling the container, removing a portion of the conductive material to expose an upper portion of the barrier layer metal provided on the sidewall of the filled container, depositing a thin second layer of the barrier layer metal encapsulating the conductive material in the container, and planarizing the thin second layer of the barrier layer metal.

In accordance with the second aspect of the present invention provided is method of forming a capacitor having an encapsulated high-dielectric constant material. The method comprises providing a substrate layer having a conductive plug, and forming a container having a bottom and sidewall from the substrate layer, in which the conductive plug is located at the bottom of the container. The method further includes depositing a thin first layer of a barrier layer metal covering the bottom and sidewall of the container in which the conductive plug contacts the first layer of the barrier layer metal, depositing a conductive material substantially completely filling the container, and depositing a thin second layer of the barrier layer metal encapsulating the conductive material in the container. The method further includes planarizing the thin second layer of the barrier layer metal, forming a layer of a high-dielectric constant material over the conductive material, and, forming a top electrode over the high-dielectric constant material.

Other objects, features and advantages will appear more fully in the course of the following discussion.

BRIEF DESCRIPTION OF THE DRAWINGS

The same reference numerals refer to the same parts through the various figure embodiments.

DESCRIPTION OF THE INVENTION

Figure 1:
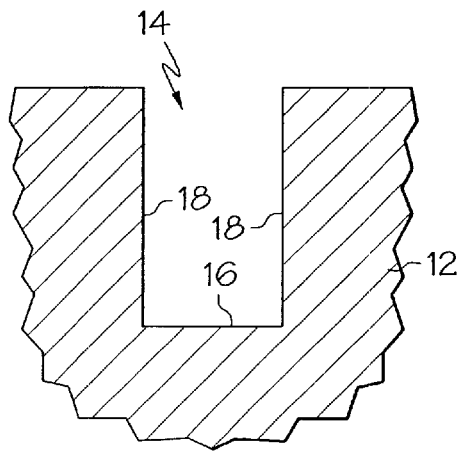
FIGS. 1–7 are cross-sectional views of a microelectronic structure according to an embodiment of the present invention in progressive steps of the fabrication of the same.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate pertinent features of the invention.

Referring to FIGS. 1–7, the fabrication of an encapsulated 3-D conductor pillar 10 (FIG. 7) on a selected portion of a substrate 12 is described in progressive steps. It should be understood that the term "substrate" is often used ambiguously in the art of integrated circuits. Often, the term "substrate" is used to refer to the underlying substrate of silicon, gallium arsenide o'r other semiconductive materials on which an integrated circuit is fabricated. Additionally, the term "substrate" can also be used to refer to the incomplete portion or immediate layer of the integrated circuit on which a particular layer is formed. In this specification, the term "substrate" is used broadly to mean any layer on which a particular layer of interest is formed. Accordingly, the substrate layer may be any one selected from the group consisting of single component semiconductor materials, compound semiconductor materials, ceramic single crystals, ceramic poly-crystals, metals, and amorphous/glassy materials. Furthermore, when functioning as an insulating layer, the material of the substrate 12 is one selected from the group consisting of $SiO_2$, $Si_3N_4$, BSG, PSG, BPSG, MgO, CaO, $CaF_2$, $Al_2O_3$ or $B_2O_3$. In the embodiments described below the substrate 12 is BPSG. Moreover, as used herein, it should be understood that the term "on" refers to forming a material layer in contact with either the entire or a portion of the underlying substrate, and "over" refers to forming a material layer above either the entire or a portion of the underlying substrate. Continuing, formed into an upper surface of the substrate 12 is a container 14 having a bottom 16 and sidewall 18.

Figure 2:
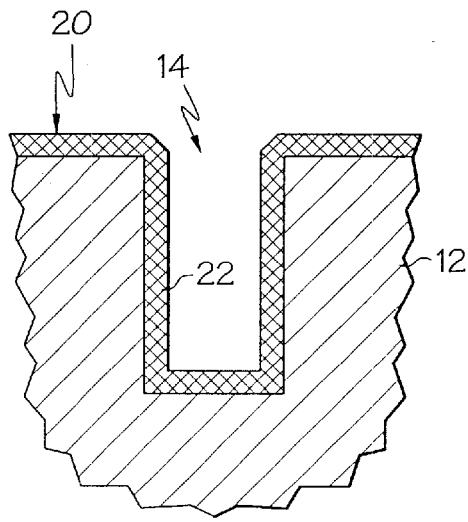

Referring now to FIG. 2, on substrate 12 deposited is a thin film 20 of a barrier layer metal 22. The term "thin" refers to a deposit layer of preferably up to about 200 Å. The barrier layer metal 22 is one selected from the group consisting of platinum, palladium, ruthenium, iridium, rhodium, osmium, silver, and gold, their oxides (e.g. $RuO_2$, $IrO_2$, $Rh_2O_3$, $OsO_2$, and $PdO_2$) and any metal which is effective as a barrier layer to prevent interdiffusion of silicon atoms and metal/conductor atoms. The thin film 20 of the barrier layer metal 22 is deposited on the substrate 12, uniformly covering the bottom 16 and sidewall 18 of the container 14 as illustrated. Preferably, chemical vapor deposition (CVD) or sputtering techniques are utilized. Additionally, the substrate 12 may be heated to provide better stability.

Figure 3:
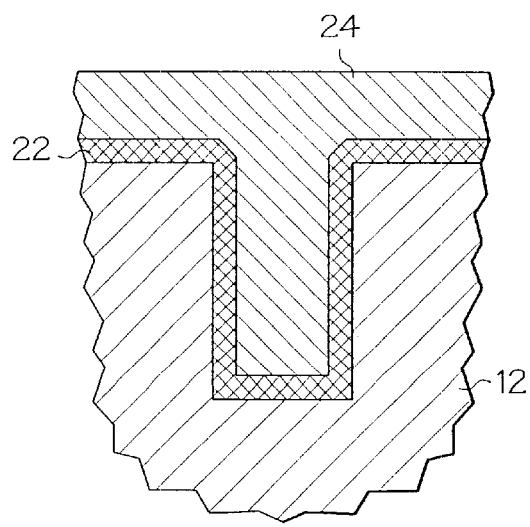

Now turning to FIG. 3, the barrier layer metal 22 is blanketed with a conductive material 24. The conductive material is deposited preferably by plasma enhanced chemical vapor deposition or ion deposition sputtering, in order to substantially completely fill the container 14. The term "substantially completely fill" refers to the characteristic of a feature, such as a container, trench or via, which is filled substantially, if not completely with a conductive material. The conductive material 24 is one selected from the group consisting of tungsten (W), tungsten silicide ($WSi_x$), ruthenium (Ru), ruthenium oxide (RuOx), and silicon nitride ($Si_3N_4$).

Figure 4:
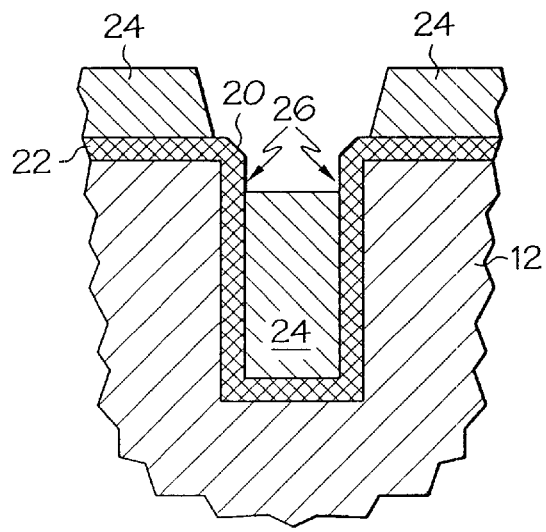

As illustrated in FIG. 4, after depositing the conductive material 24 an in situ, highly directional cleaning is performed. The conductive material 24 is cleaned with a fluorinated product, such as $NF_3$ clearing away an upper portion 26 of the filled container 14 and exposing the barrier layer 20 that surrounds the opening of the filled container. Additionally, the upper portion 26 extends a predetermined depth into the filled container 14.

Figure 5:
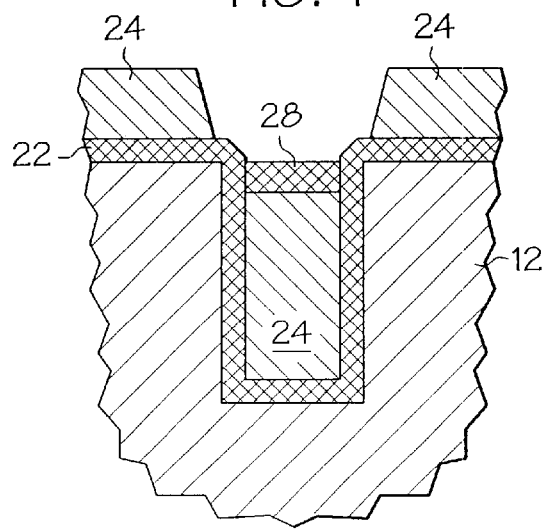
Figure 6:
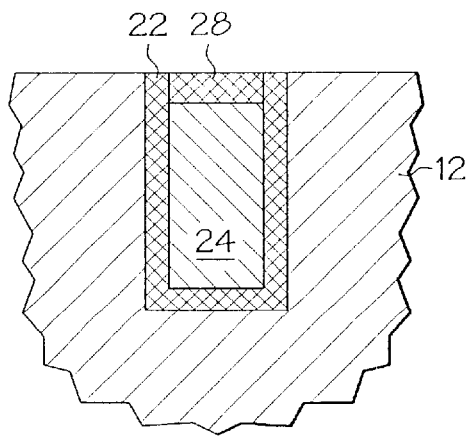

As shown in FIG. 5, a second layer 28 of the barrier layer metal 22 is deposited in the upper portion 26 of the filled container 14 thereby encapsulating the conductive material 24 in the barrier layer metal 22. In this step, the second layer 28 of the barrier layer metal 22 is preferably deposited by CVD or sputtering to a thickness of preferably about 200 Å.

Figure 7:
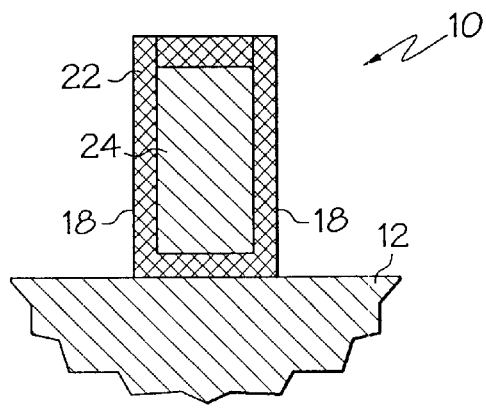

To reveal the pillar 10 as shown in FIG. 7, the material surrounding the encapsulating barrier layer metal 22 of the conductive material 24 must be removed. To remove these materials, the barrier layer metal 22 provided in the upper portion 26 of the container 14 is planarized by any conventional planarizing technique including Chemical Mechanical Planarization (CMP), thereby forming the microelectronic structure illustrated by FIG. 6. Next, anisotropic etching is utilized to remove the remaining materials thereby exposing the sidewall 18 of the pillar 10 as illustrated in FIG. 7. It should be appreciated that the above described microelectronic stricture is useful as a bottom electrode in a microelectronic capacitor. The steps to complete a microelectronic capacitor with the above described pillar 10 are described with reference to FIGS. 8 and 9.

Figure 8:
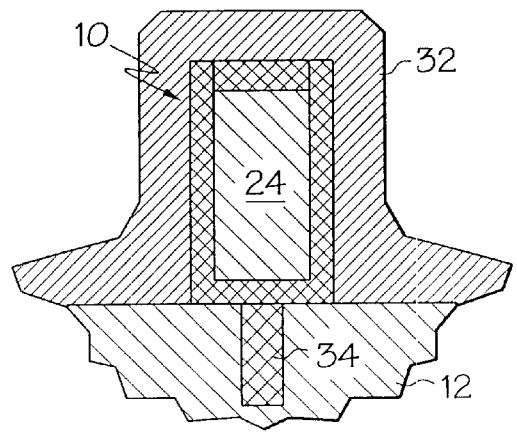
FIG. 8–9 are cross-sectional views of a microelectronic capacitor according to another embodiment of the present invention in progressive steps of the fabrication of the same.

In FIG. 8, a dielectric layer 32 is formed over the pillar 10. Since the pillar 10 is serving as the bottom electrode in an integrated circuit, typically a conductive plug 34 is provided at the bottom of the container 14 by any suitable conventional method before depositing the barrier layer metal 22 in the processes steps described above. The conductive plug is a material selected from the group consisting of TiN, zirconium nitride, titanium silicide, tantalum silicide, tungsten silicide, molybdenum silicide, nickel silicide, cobalt silicide, tantalum carbide, tantalum boride, polysilicon, germanium, W, Ta, Ti, Mo, TiW, boron carbide, and Cu and the like. As known, the conductive plug 34 contacts other contact areas, such as a source/drain, provided in another substrate layer. Dielectric layer 32 is a high dielectric constant dielectric, typically having a dielectric constant greater than 50, wherein the exact nature of this layer will depend upon the application. An example of high dielectric constant material typically used is selected from the group consisting of perovskites such as barium-strontium titanate (BST), $Ta_2O_5$, $TiO_2$, ferroelectrics such as $Pb(Zr,Ti)O_3$, $(Pb,La)(Zr,Ti)O_3$, Nb doped PZT, doped PZT, $Bi_4Ti_3O_{12}$, $SrBi_2(Ta,Nb)_2O_9$, pyroelectrics, and high dielectric constant oxides. Dielectric layer 32 may extend over the entirety of the area of the substrate 12 thereby simplifying the process of fabricating the integrated circuit, since a mask and a sequence of patterning steps may be omitted. Alternatively, if the layer 32 is specifically patterned, the patterning is done in an area of the integrated circuit which is surrounded by insulator and in which no critical parts are located, and thus it can be done with much greater tolerances, which also simplifies the overall process.

A heat treatment is performed at an elevated temperature of about 400° C. to about 900° C. for about 1 minute to 3 hours, wherein the treatment preferably includes rapid thermal anneal (RTA) and/or furnace anneal.

Figure 9:
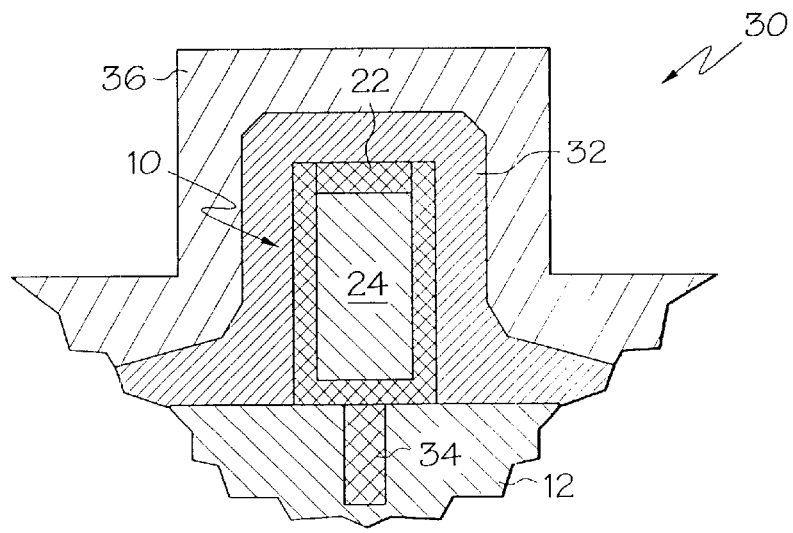

Next, as illustrated by FIG. 9, a top electrode layer 36 is formed, preferably by sputtering over the dielectric layer 32 to complete the microelectronic capacitor. The top electrode layer is preferably platinum, or any other conventionally used material. Additional conventional layers may then be deposited over the top electrode layer 36, such as a protective layer of tantalum, hafnium, tungsten, niobium and zirconium as is known. It should be appreciated that the dielectric layer 32 sandwiched between electrodes 10 and 36 together form an electronic component which changes its electronic state during operation in a completed integrated circuit. This is in contrast to other dielectric layers, such as an interlayer dielectric, which does not change its electronic state during the operation of the integrated circuit. Furthermore, although FIG. 8 shows the use of the pillar 10 as a bottom electrode in the microelectronic capacitor 30, the technique of encapsulating a conductive material as illustrated in FIGS. 1–5, can be used with a conductor line as well. For example, copper or silver encapsulated in Al or Ta, or Ti, and the like. It is to be appreciated that the microelectronic structure formed by the illustrative processes of FIGS. 1–7 may be used in a computer system as part of its memory device or as part of its integrated circuitry. Additionally, the microelectronic capacitor formed by the illustrated processes of FIGS. 1–9, may be used in a computer system as part of its memory device or its integrated circuitry.

Figure 10:
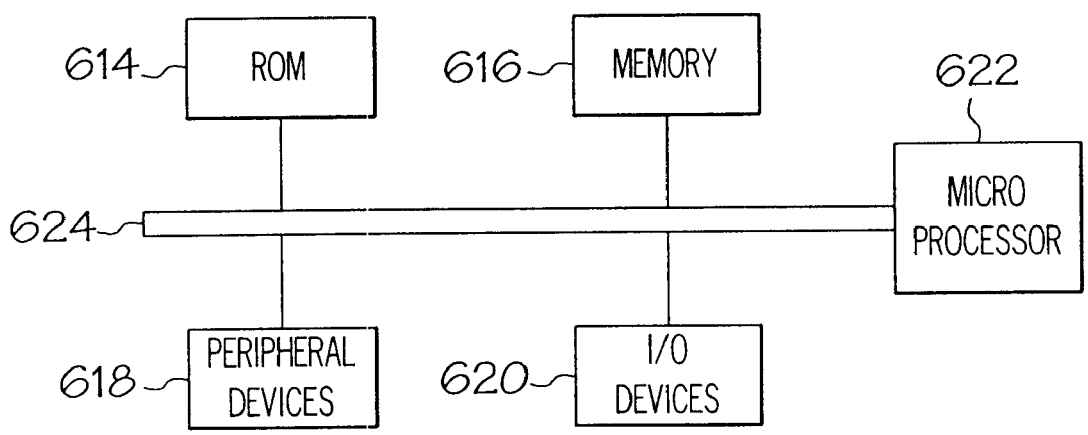
FIG. 10 is a computer system comprised of a number of microelectronic devices which may be fabricated with the embodiments of the present invention.

FIG. 10 is an illustration of a computer system 612 that can use and be used with embodiments of the present invention. As will be appreciated by those skilled in the art, the computer system 612 has a number of microelectronic devices that include, for example, ROM 614, mass memory 616, peripheral devices, and I/O devices 620 in communication with a microprocessor 622 via a data bus 624 or another suitable data communication path. These devices can be fabricated according with the various embodiments of the present invention.

In a typical embodiment, the following ranges of layer thicknesses and sizes may be used. As will be appreciated by those persons skilled in the art, these numbers may be modified to suit various processing requirements. The size of the container thus has a width ranging from preferably about 1500 Å to about 2000 Å, and a height ranging from preferably about 2000 Å to about 30000 Å. Accordingly, the dielectric layer 32 has a thickness of preferably about 30 Å, and the top electrode layer a thickness of preferably about 500 Å.

Having thus described the present invention in detail and by reference to preferred embodiments thereof, it will be apparent that modifications and variations are possible without departing from the scope of the invention detailed in the appended claims.

What is claimed is:

1. A method of forming an encapsulated microelectronic structure suitable for use with a high-dielectric constant material, the method comprising:
   providing a substrate layer;
   forming a container having a bottom and sidewall from said substrate layer;
   depositing a thin first layer of a barrier layer metal covering at least said bottom and sidewall of said container;
   depositing a conductive material substantially completely filling said container;
   removing a portion of said conductive material from said filled container to expose an upper interior sidewall portion of said barrier layer metal;
   depositing a thin second layer of said barrier layer metal encapsulating said conductive material in said container; and
   planarizing said thin second layer of said barrier layer metal.

2. The method of claim 1, further comprising removing said substrate layer surrounding said container to reveal an encapsulated conductive pillar.

3. The method of claim 2, wherein said removing is performed by anisotropic etching.

4. The method of claim 2, further comprising heat treating said pillar at an elevated temperature of about 400° C. to about 900° C. for about 1 minute to 3 hours.

5. The method of claim 2, wherein said substrate layer includes a conductive plug, said conductive plug being located at said bottom of said container contacting said first layer of said barrier layer metal.

6. The method of claim 1, wherein said substrate layer includes a conductive plug, said conductive plug being located at said bottom of said container contacting said first layer of said barrier layer metal.

7. The method of claim 6, further comprising forming a layer of a high-dielectric constant material over at least said barrier metal.

8. The method of claim 7, further comprising forming a top electrode over said high-dielectric constant material to form a microelectronic capacitor.

9. The method of claim 7, wherein said dielectric layer has a thickness of about 30 Å.

10. The method of claim 7, wherein said high dielectric layer material is selected from the group consisting of perovskites, ferroelectrics, pyroelectrics, and high dielectric constant oxides.

11. The method of claim 8, wherein said top electrode is platinum.

12. The method of claim 8, wherein said top electrode layer has a thickness of about 500 Å.

13. The method of claim 6, wherein said conductive plug is selected from the group consisting of TiN, zirconium nitride, titanium silicide, tantalum silicide, tungsten silicide, molybdenum silicide, nickel silicide, cobalt silicide, tantalum carbide, tantalum boride, polysilicon, germanium, W, Ta, Ti, Mo, TiW, boron carbide, and Cu.

14. The method of claim 1, wherein said substrate layer is selected from the group consisting of single component semiconductor materials, compound semiconductor materials, ceramic single crystals, ceramic poly-crystals, metals, and amorphous/glassy materials.

15. The method of claim 1, wherein said barrier layer metal is selected from the group consisting of platinum, palladium, ruthenium, iridium, rhodium, osmium, silver, gold, $RuO_2$, $IrO_2$, $Rh_2O_3$, $OsO_2$, and $PdO_2$.

16. The method of claim 1, wherein said conductive material is selected from the group consisting of W, $WSi_x$, Ru, RuOx, and $Si_3N_4$.

17. The method of claim 1, wherein said depositing is by chemical vapor depositing (CVD).

18. The method of claim 1, wherein said depositing is by sputtering.

19. The method of claim 1, wherein said planarizing is performed by chemical mechanical planarization.

20. The method of claim 1, wherein said first layer of the barrier metal is deposited to a thickness of about 200 Å.

21. The method of claim 1, wherein said second layer of the barrier metal is deposited to a thickness of about 200 Å.

22. The method of claim 1, wherein said container has a width ranging from about 1500 Å to about 2000 Å, and a height ranging from about 2000 Å to about 30000 Å.

23. A method of forming an encapsulated microelectronic structure suitable for use with a high-dielectric constant material, the method comprising:

providing a substrate layer having a surface;

forming a container having a bottom and sidewall from said substrate layer;

depositing a thin first layer of a barrier layer metal covering said bottom and sidewall of said container and said surface of said substrate;

depositing a conductive material covering said first layer of a barrier layer metal and completely filling said container;

removing a portion of said conductive material to expose an upper interior sidewall portion of said barrier layer metal provided on said sidewall of said filled container;

depositing a thin second layer of said barrier layer metal at least between said upper interior sidewall portion encapsulating said conductive material in said container; and planarizing said thin second layer of said barrier layer metal.

24. The method of claim 23, wherein said removing is performed with an in situ, highly directional cleaning with a fluorinated cleaner.

25. The method of claim 23, further comprising removing said substrate layer surrounding said container to reveal an encapsulated conductive pillar.

26. The method of claim 25, further comprising the step of heat treating said pillar at an elevated temperature of about 400° C. to about 900° C. for about 1 minute to 3 hours.

27. The method of claim 25, wherein said removing is performed by anisotropic etching.

28. The method of claim 23, wherein said substrate layer includes a conductive plug, said conductive plug being located at said bottom of said container contacting said first layer of said barrier layer metal.

29. The method of claim 28, wherein said conductive plug is selected from the group consisting of TiN, zirconium nitride, titanium silicide, tantalum silicide, tungsten silicide, molybdenum silicide, nickel silicide, cobalt silicide, tantalum carbide, tantalum boride, polysilicon, germanium, W, Ta, Ti, Mo, TiW, boron carbide, and Cu.

30. The method of claim 28, further comprising forming a layer of a high-dielectric constant material over at least said barrier metal.

31. The method of claim 30, wherein said high dielectric layer material is selected from the group consisting of perovskites, ferroelectrics, pyroelectrics, high dielectric constant oxides, BST, $Ta_2O_5$, $TiO_2$, $Pb(Zr,Ti)O_3$, $(Pb,La)(Zr, Ti)O_3$, Nb doped PZT, doped PZT, $Bi_4Ti_3O_{12}$, and $SrBi_2(Ta,Nb)_2O_9$.

32. The method of claim 30, further comprising forming a top electrode over said high-dielectric constant material to form a microelectronic capacitor.

33. The method of claim 32, wherein said top electrode is selected from the group consisting of a conventional electrode material and platinum.

34. The method of claim 25, wherein said substrate layer includes a conductive plug which contacts said first layer of said barrier layer metal.

35. The method of claim 34, further comprising forming a layer of a high-dielectric constant material over at least said pillar.

36. The method of claim 35, wherein said high dielectric layer material is selected from the group consisting of perovskites, ferroelectrics, pyroelectrics, and high dielectric constant oxides.

37. The method of claim 35, wherein said high dielectric layer material is selected from the group consisting BST, $Ta_2O_5$, $TiO_2$, $Pb(Zr,Ti)O_3$, $(Pb,La)(Zr,Ti)O_3$, Nb doped PZT, doped PZT, $Bi_4Ti_3O_{12}$, and $SrBi_2(Ta,Nb)_2O_9$.

38. The method of claim 35, further comprising forming a top electrode over at least said high-dielectric constant material to form a microelectronic capacitor.

39. The method of claim 23, wherein said substrate layer is selected from the group consisting of single component semiconductor materials, compound semiconductor materials, ceramic single crystals, ceramic poly-crystals, metals, and amorphous/glassy materials.

40. The method of claim 23, wherein said barrier layer metal is selected from the group consisting of platinum, palladium, ruthenium, iridium, rhodium, osmium, silver, gold, $RuO_2$, $IrO_2$, $Rh_2O_3$, $OsO_2$, and $PdO_2$.

41. The method of claim 23, wherein said conductive material is selected from the group consisting of W, $WSi_x$, Ru, RuOx, and $Si_3N_4$.

42. A method of forming a capacitor having an encapsulated high-dielectric constant material, the method comprising:

providing a substrate layer having a conductive plug;

forming a container having a bottom and sidewall from said substrate layer, said conductive plug being located at said bottom of said container;

depositing a thin first layer of a barrier layer metal covering said bottom and sidewall of said container in which said conductive plug contacts said first layer of said barrier layer metal;

depositing a conductive material substantially completely filling said container;

depositing a thin second layer of said barrier layer metal encapsulating said conductive material in said container;

planarizing said thin second layer of said barrier layer metal;

forming a layer of a high-dielectric constant material over at least said encapsulated conductive material; and, forming a top electrode over said high-dielectric constant material.

43. The method of claim 42, wherein said high dielectric layer material is selected from the group consisting of perovskites, ferroelectrics, pyroelectrics, and high dielectric constant oxides.

44. The method of claim 43, wherein said substrate layer is selected from the group consisting of single component semiconductor materials, compound semiconductor materials, ceramic single crystals, ceramic poly-crystals, metals, and amorphous/glassy materials.

45. The method of claim 43, wherein said barrier layer metal is selected from the group consisting of platinum, palladium, ruthenium, iridium, rhodium, osmium, silver, gold, $RuO_2$, $IrO_2$, $Rh_2O_3$, $OsO_2$, and $PdO_2$.

46. The method of claim 43, wherein said conductive material is selected from the group consisting of W, $WSi_x$, Ru, RuOx, and $Si_3N_4$.

47. The method of claim 43, wherein said conductive plug is selected from the group consisting of TiN, zirconium nitride, titanium silicide, tantalum silicide, tungsten silicide, molybdenum silicide, nickel silicide, cobalt silicide, tantalum carbide, tantalum boride, polysilicon, germanium, W, Ta, Ti, Mo, TiW, boron carbide, and Cu.

48. The method of claim 43, wherein said high dielectric layer material is selected from the group consisting of perovskites, ferroelectrics, pyroelectrics, high dielectric constant oxides, BST, $Ta_2O_5$, $TiO_2$, $Pb(Zr,Ti)O_3$, $(Pb,La)(Zr,Ti)O_3$, Nb doped PZT, doped PZT, $Bi_4Ti_3O_{12}$, and $SrBi_2(Ta,Nb)_2O_9$.

49. The method of claim 43, wherein said top electrode is selected from the group consisting of a conventional electrode material and platinum.

50. The method of claim 42, wherein said high dielectric layer material is selected from the group consisting BST, $Ta_2O_5$, $TiO_2$, $Pb(Zr,Ti)O_3$, $(Pb,La)(Zr,Ti)O_3$, Nb doped PZT, doped PZT, $Bi_4Ti_3O_{12}$, and $SrBi_2(Ta,Nb)_2O_9$.

51. The method of claim 42, wherein said substrate layer is selected from the group consisting of single component semiconductor materials, compound semiconductor materials, ceramic single crystals, ceramic poly-crystals, metals, and amorphous/glassy materials.

52. The method of claim 42, wherein said barrier layer metal is selected from the group consisting of platinum, palladium, ruthenium, iridium, rhodium, osmium, silver, gold, $RuO_2$, $IrO_2$, $Rh_2O_3$, $OsO_2$, and $PdO_2$.

53. The method of claim 42, wherein said conductive material is selected from the group consisting of W, $WSi_x$, Ru, RuOx, and $Si_3N_4$.

54. The method of claim 42, wherein said conductive plug is selected from the group consisting of TiN, zirconium nitride, titanium silicide, tantalum silicide, tungsten suicide, molybdenum silicide, nickel silicide, cobalt silicide, tantalum carbide, tantalum boride, polysilicon, germanium, W, Ta, Ti, Mo, TiW, boron carbide, and Cu.

55. The method of claim 54, wherein said conductive plug is selected from the group consisting of TiN, zirconium nitride, titanium silicide, tantalum silicide, tungsten silicide, molybdenum silicide, nickel silicide, cobalt silicide, tantalum carbide, tantalum boride, polysilicon, germanium, W, Ta, Ti, Mo, TiW, boron carbide, and Cu.

56. The method of claim 42, wherein said top electrode is a conventional electrode material.

57. A method of forming a capacitor having an encapsulated high-dielectric constant material, the method comprising:

providing a substrate layer having a conductive plug;

forming a container having a bottom and sidewall from said substrate layer, said conductive plug being located at said bottom of said container;

depositing a thin first layer of a barrier layer metal covering said bottom and sidewall of said container in which said conductive plug contacts said first layer of said barrier layer metal;

depositing a conductive material substantially completely filling said container;

removing a portion of said conductive material from said filled container to expose an upper interior sidewall portion of said barrier layer metal;

depositing a thin second layer of said barrier layer metal covering said upper interior side wall portion and encapsulating said conductive material in said container;

planarizing said thin second layer of said barrier layer metal;

removing said substrate layer surrounding said container to reveal a majority of an encapsulated conductive pillar;

forming a layer of a high-dielectric constant material over said encapsulated conductive pillar; and, forming a top electrode over said high-dielectric constant material.

* * * * *

UNITED STATES PATENT AND TRADEMARK OFFICE
CERTIFICATE OF CORRECTION

PATENT NO.     : 6,537,912 B1
DATED          : March 25, 2003
INVENTOR(S)    : Vishnu Kumar Agarwal Page 1 of 1

It is certified that error appears in the above-identified patent and that said Letters Patent is hereby corrected as shown below:

Column 3,
Line 40, reads as "arsenide o'r other" should read -- arsenide or other --.

Column 9,
Lines 3, 8, 12, 15, 21 and 27 reads as "claim 43" should read -- claim 57 --.

Column 10,
Line 1, reads as "tungsten suicide" should read -- tungsten silicide --.
Line 5, reads as "claim 54" should read -- claim 5 --.

Signed and Sealed this

Nineteenth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,537,912 B1
DATED : March 25, 2003
INVENTOR(S) : Vishnu Kumar Agarwal It is certified that error appears in the above-identified patent and that said Letters Patent is hereby corrected as shown below:

Column 3,
Line 40, reads as "arsenide o'r other" should read -- arsenide or other --.

Column 9,
Lines 3, 8, 12, 15, 21 and 27, reads as "claim 43" should read -- claim 57 --.

Column 10,
Line 5, reads as "claim 54" should read -- claim 5 --.

Signed and Sealed this

Seventh Day of October, 2003

JAMES E. ROGAN
*Director of the United States Patent and Trademark Office*